United States Patent [19]
Dansky et al.

[11] Patent Number: 5,121,001
[45] Date of Patent: Jun. 9, 1992

[54] LOW POWER PUSH-PULL DRIVER

[75] Inventors: Allan H. Dansky, Poughkeepsie; Allan L. Mullgrav, Jr., Wappingers Falls, both of N.Y.

[73] Assignee: International Business Machines, Corp., Armonk, N.Y.

[21] Appl. No.: 654,152

[22] Filed: Feb. 12, 1991

[51] Int. Cl.[5] .................... H03K 17/16; H03K 17/60; H03K 19/003
[52] U.S. Cl. .................... 307/443; 307/246
[58] Field of Search ............ 307/443, 540, 542, 542.1, 307/549, 550, 557, 246, 254

[56] References Cited

U.S. PATENT DOCUMENTS

| | | | |
|---|---|---|---|
| 4,605,870 | 8/1986 | Dansky et al. | 307/443 |
| 4,668,879 | 5/1987 | Dansky et al. | 307/454 |
| 4,678,940 | 7/1987 | Vasseghi et al. | 307/446 |
| 4,680,480 | 7/1987 | Hopta | 307/270 |
| 4,710,842 | 12/1987 | Suzuki et al. | 361/88 |
| 4,766,399 | 8/1988 | Davis et al. | 331/111 |
| 4,835,420 | 5/1989 | Rosky | 307/475 |

OTHER PUBLICATIONS

C. K. Chuang et al., "High-Speed ECL Circuit", IBM Technical Disclosure Bulletin, vol. 32, No. 4A, Sep. 1989, pp. 374-380.
Ostaszewski et al., "Sea-Of-Cells ECL Arrays Come of Age", VLSI Systems Design, Nov. 1988, pp. 18, 22, 24, 28, and 32.

*Primary Examiner*—David Mis
*Attorney, Agent, or Firm*—Perman & Green

[57] ABSTRACT

A push-pull driver circuit operative with two input logic signals of opposite sense has a first bipolar transistor with a base terminal connected to a first input signal, and an emitter terminal connected to a second bipolar transistor which takes the place of the emitter resistor in the usual construction of an emitter follower circuit. During an activation of the first transistor to pass current, this being the pull-up stage, the second transistor is in a quiescent state to develop a voltage drop provided by current flow from the first transistor. A current mirror maintains a small quiescent current in the second transistor so that it can be activated rapidly upon occurrence of the pull-down transition. During a deactivation of the first transistor to terminate current flow in the first transistor, the voltage drop across the second transistor decreases, this being the pull-down stage. The voltage drop across the second transistor serves as an output signal of the driver circuit. During the pull down stage, the second transistor is activated momentarily via the capacitance of a back-biased transistor to pass current for rapid reduction of the voltage drop across the second transistor, this being in response to the second input signal. To avoid placing the second transistor in a state of saturation, a bypass transistor is connected across the base-collector terminal of the second transistor in the reverse direction of current flow in the second transistor to prevent the development of excessive base drive to the second transistor.

16 Claims, 2 Drawing Sheets

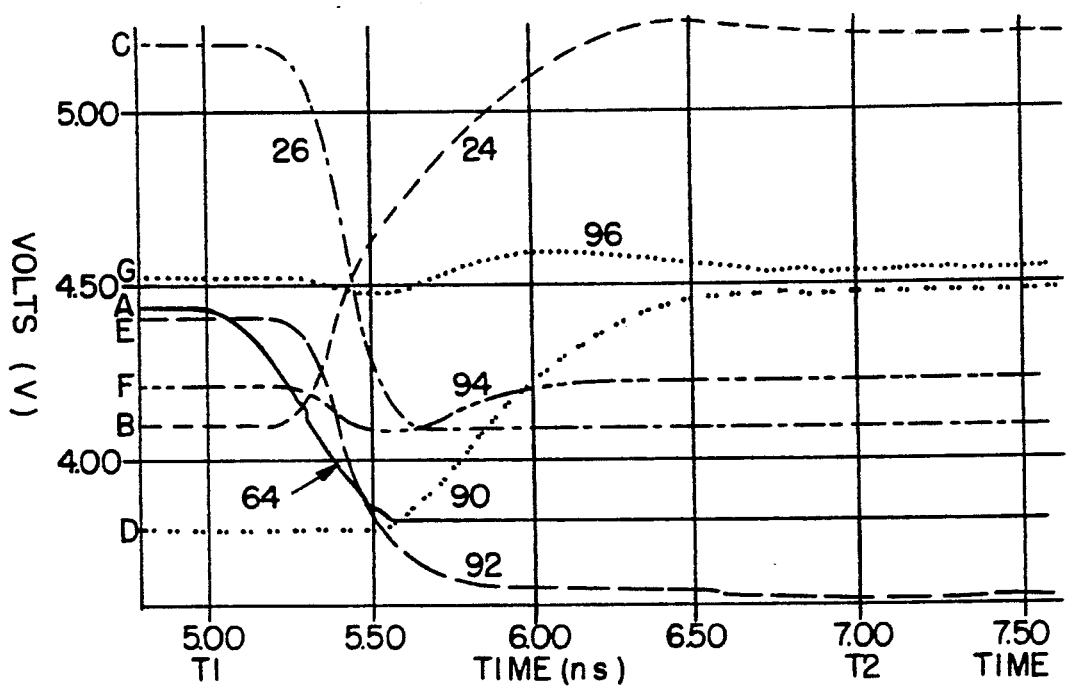
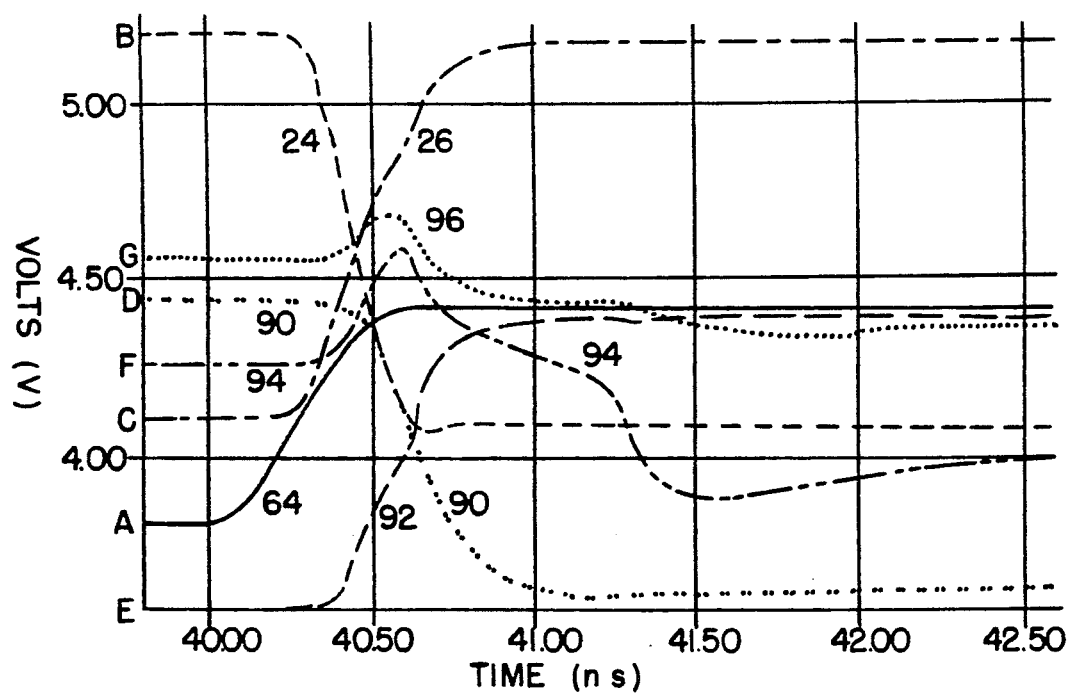

1

LOW POWER PUSH-PULL DRIVER

BACKGROUND OF THE INVENTION

This invention relates to a driver circuit for coupling output electric signals from a logic circuit, to other circuits located on a chip with the logic circuit, the driver circuit having sufficient power to drive logic signals through an environment of electric conductors having significant wiring capacitance and, more particularly, to a push-pull driver constructed for minimization of average power dissipation so as to allow a more dense arrangement of circuits on a semiconductor chip without exceeding cooling capacity of the chip.

In the construction of computer systems and other systems employing large arrays of logic circuits, it has proven advantageous to construct the circuits in dense arrays upon a semiconductor chip. The dense arrays allows more functions to be located on a single chip so as to facilitate the design of computers and systems including data processing and control systems. Also, the dense arrangement of components decreases transit times of signals propagating among circuits of the chip for a faster operation of the system.

The electrical conductors interconnecting the various circuits on a chip present capacitance to the output terminals of logic circuits on the chip. To obtain a fast transmission of signals among the circuits, it is the practice to employ driver circuits at the output terminals of the logic circuits to boost the power output of the logic circuit sufficiently to charge the capacitors represented by the intercircuit wiring. By impressing large currents upon the intercircuit wiring, the driver circuits are able to overcome the capacitance effects of the intercircuit wiring and provide for rapid transmission of signals among the circuits.

By way of example in the form of circuits employed on a computer chip, a cascode current switch is a common form of logic circuit, and an emitter follower is a common form of driver circuit. Typically, the emitter follower circuit is teamed with the cascode circuit to apply output signals of the cascode circuit to other circuits on the chip. The emitter follower circuit includes, by way of example, a bipolar transistor and a resistor connected to the emitter terminal of the bipolar transistor. During a portion of a logic signal, the transistor is placed in a conduction mode to drive current through the resistor to produce a voltage drop across the resistor, the voltage drop representing the output signal which is applied to the other circuits. This is sometimes referred to as the pull-up voltage, and occurs relatively rapidly. During a further portion of the logic signal, the transistor is placed in a state of nonconduction to allow the current and the voltage drop across the resistor to drop to zero. This is sometimes referred to as the pull-down voltage. However, during the pull-down voltage stage of the output signal, the voltage drop occurs at a rate dependent on the wiring capacitance and the resistance of the resistor which serves to discharge the wiring capacitance. Thus, the pull-down voltage may occur relatively slowly unless the resistance is sufficiently small for a rapid discharge of capacitance.

A problem arises in the use of a small emitter resistor because the resistor draws much current with a resultant large amount of power dissipation. As a result of the large amount of power dissipation, the use of the emitter-follower driver circuits produces inefficiency in the operation of the circuit chip and increase the burden of cooling equipment in attempting to maintain the chip temperature at a safe operating temperature. In particular, it is noted that the large power drain of the emitter follower circuits limits the density of circuits to be constructed on a single chip because of excessive temperature rise during operation of the chip. One solution to this problem is the use of a push-pull driver disclosed in Dansky, U.S. Pat. No. 4,605,870, the teachings of which are included herein by reference. The present invention represents an improvement of the circuit disclosed in that patent.

SUMMARY OF THE INVENTION

The aforementioned problem is overcome and other advantages are provided by a push-pull driver circuit operative with two input signals of opposite sense, such as are provided at output terminals of a cascode current switch logic circuit. The driver circuit comprises a first bipolar transistor having a base terminal connected to a first output terminal of the cascode circuit, and an emitter terminal connected to a second bipolar transistor which takes the place of the emitter resistor in the usual construction of an emitter follower circuit. During an activation of the first transistor to pass current, this being the pull-up stage, the second transistor is in a quiescent state to develop the voltage drop provided by current flow from the first transistor through the load. During a deactivation of the first transistor to terminate current flow in the first transistor, the voltage drop across the second transistor decreases, this being the pull-down stage. The voltage at the collector terminal of the second transistor serves as an output signal of the driver circuit.

In accordance with a feature of the invention, during the pull down stage, the second transistor is activated momentarily to pass current for rapid reduction of the voltage drop across the second transistor. The current flow in the second transistor during the pull-down stage provides sufficient power to discharge rapidly capacitance presented by wiring connected to the output terminal of the driver circuit, which wiring is typically the intercircuit wiring of a semiconductor circuit chip. Thus, the driver circuit of the invention provides a rapid transition in state of output voltage during the pull-up stage and also during the pull-down stage.

A feature of the invention provides that the two output logic states of the driver circuit, namely, the low voltage state and the high voltage state, can be maintained with no more than a minimal quiescent current flow in the first transistor and in the second transistor. High current flow in the first transistor occurs only during the leading edge of a logic signal at the inception of the pull-up stage. High current flow in the second transistor occurs only during the leading edge of a logic signal at the inception of the pull-down stage. As a result, there is a significant reduction in power dissipated by the driver circuit as compared with an emitter follower.

In order to insure rapid response by the second transistor, it is important, in accordance with a further feature of the invention, to avoid placing the second transistor in a state of saturation. This is accomplished by providing the driver circuit with a third transistor, a fourth transistor, a fifth transistor and a set of three resistors which constitute an activation circuit for activating the second transistor. The activation circuit is driven by a second output terminal of the cascode circuit, and provides a momentary activation of current flow in the second transistor in response to the leading edge of the signal from the second output terminal of the cascode circuit. The third transistor is biased to accentuate the capacitance of the base-collector junction of the transistor to provide for coupling of the signal from the second output terminal of the cascode circuit only during the leading edge of the signal. At other times the third transistor may be regarded as essentially dormant with respect to transmission of signal to the second transistor, and the second transistor is held in a quiescent current state by a base current feed formed by two of the resistors when the second transistor is activated. When the second transistor is deactivated, a small quiescent current is maintained in the second transistor by the current mirror comprised of the three resistors and the third transistor. This state of readiness provides a speedy turn-on at the next pull-down signal.

The fourth transistor is connected across the base-collector terminal of the second transistor in the reverse direction of current flow in the second transistor to prevent the development of excessive base drive to the second transistor during the transmission of signal to the base terminal via the capacitance of the third transistor. Biasing for the fourth transistor is provided by the two resistors of the current feed. The fifth transistor and the third of the resistors are connected in the manner of an emitter follower to couple the signal of the second output terminal of the cascode circuit to the third transistor. The fifth transistor operates to provide a relatively high power, via the capacitance of the third transistor, to activate the second transistor at the inception of the pull-down stage

BRIEF DESCRIPTION OF THE DRAWING

The aforementioned aspects and other features of the invention are explained in the following description, taken in connection with the accompanying drawing wherein:

FIGS. 3a and 3b together constitute a set of computer simulated graphs of voltages at various locations within the driver circuit of FIG. 2, FIG. 3a showing the pull-up transition and FIG. 3b showing the pull-down transition of a pulse signal.

DETAILED DESCRIPTION

Figure 1:
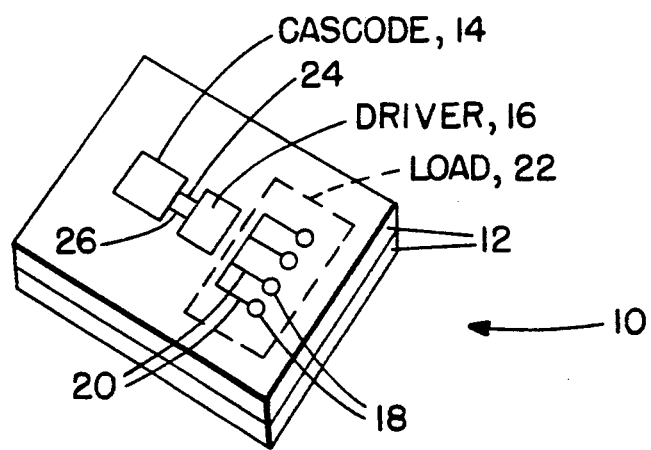
FIG. 1 is a stylized view of a portion of a circuit chip with circuits, including a driver circuit of the invention, being indicated diagrammatically.

FIG. 1 shows a portion of a circuit chip 10 constructed of a plurality of layers 12 (only two of which are shown for simplicity) which may include electrically conductive material, and semiconductor material as is employed in the construction of semiconductor circuit chips. Assuming, by way of example, that the chip 10 is part of a computer, the chip 10 would include an interconnection of logic circuits such as a cascode current switch circuit 14 providing an output signal via a driver circuit 16 to fan out to a plurality of further logic circuits 18 via a set of electrically conductive metallic strips, or leads 20, connecting the driver circuit 16 to the logic circuits 18. The logic circuits 18 and the leads 20, including capacitance between the leads 20 and metallic material in the layers 12 constitutes a load 22 to be driven by the driver circuit 16. The capacitive portion of the load 22 requires sufficient power from the driver during both positive and negative transitions of logic signals outputted by the cascode circuit 14 to charge the capacitive portion of the load 22 to enable rapid transmission of logic signals from the driver circuit 16 to the logic circuits 18.

In accordance with the invention, the driver circuit 16 provides for the rapid transmission of logic signals from the cascode circuit 14 to the load 22 while reducing the average power dissipation in the driver circuit 16. The driver circuit 16 operates with a pair of complementary input logic signals provided by the cascode circuit 14 via lines 24 and 26, the pair of complementary input logic signals enabling the driver circuit 16 to provide a push-pull function for driving the load 22 with current during both positive and negative transitions in a logic signal. This will be explained in further detail in FIG. 2.

Figure 2:
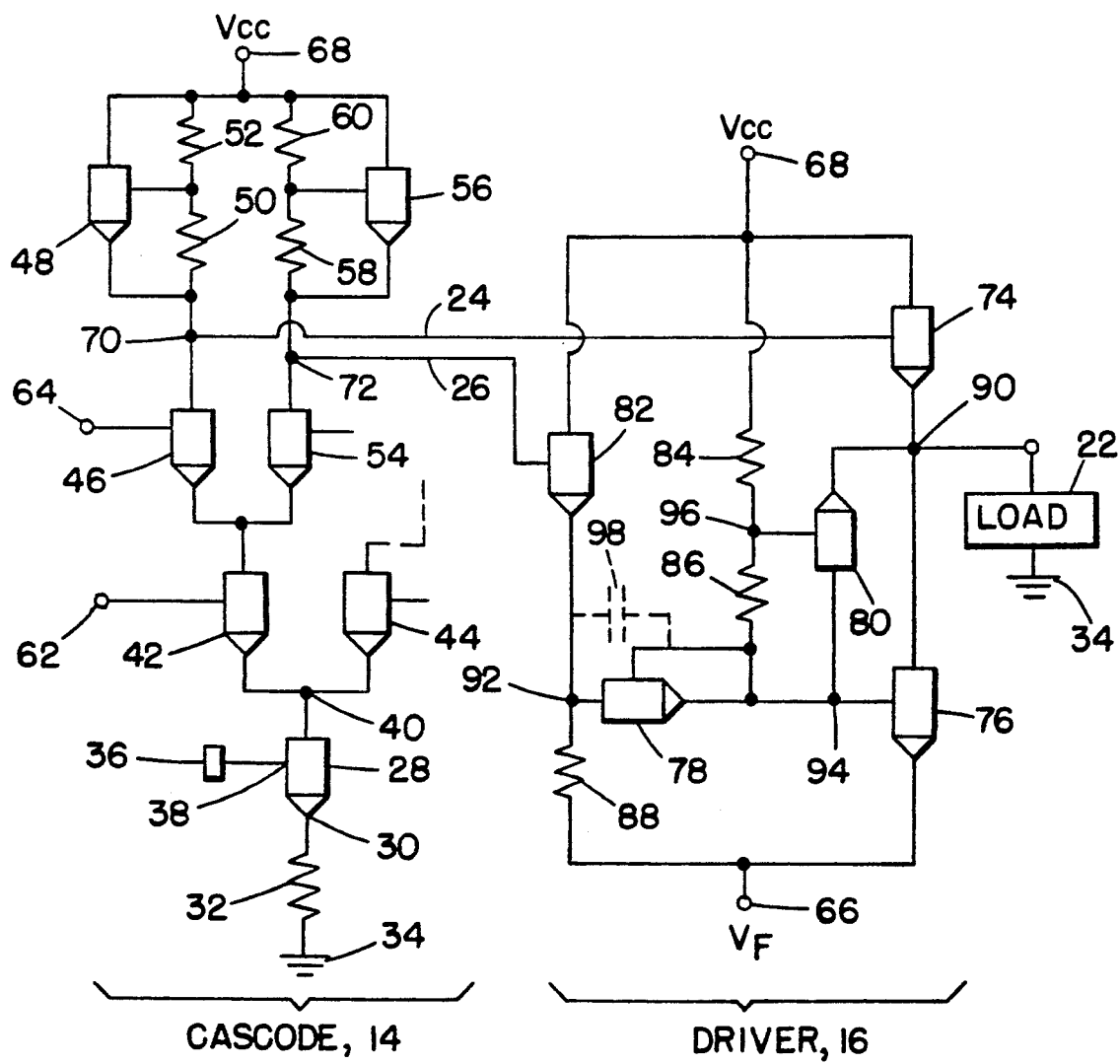
FIG. 2 is an electrical schematic diagram of a cascode circuit connected to a push/pull driver circuit constructed in accordance with the invention.

FIG. 2 shows connection of the cascode circuit 14 to the load 22 via the driver circuit 16, and includes details in the construction of both the cascode circuit 14 and the driver circuit 16. The cascode circuit 14 is provided as example of a logic circuit providing a pair of complementary output signals suitable for operation of the driver circuit 16. The cascode circuit 14 is constructed in the manner of a tree with a plurality of branches which fan into a common current source provided by a bipolar transistor 28 having an emitter terminal 30 connected by a resistor 32 to ground 34. A well-known bias voltage circuit 36 provides DC bias to a base terminal 38 of the transistor 28 for activating the transistor to drive current through the cascode circuit 14. The collector terminal 40 of the transistor 28 is connected to two branches of the cascode circuit 14, the two branches being represented by bipolar transistors 42 and 44. The branch of the transistor 42 divides into a left branch and a right branch, the left branch comprising bipolar transistors 46 and 48 and resistors 50 and 52. The right branch comprises bipolar transistors 54 and 56 and resistors 58 and 60. Further construction of the branch with the transistor 44 has the same form as the branch with the transistor 42, and is indicated diagrammatically via dashed line 46. Two input terminals 62 and 64 are provided for the branch of the cascode circuit 14 represented by the transistor 42, the input terminal 62 being connected to the base terminal of the transistor 42 and the input terminal 64 being connected to the base terminal of the transistor 46.

In operation, the transistors 28, 42, 44, 46, 54, 48 and 56 are type NPN. The resistors 50 and 52 are connected serially between a source 68 of positive voltage Vcc and a junction 70 between the emitter terminal of the transistor 48 and the collector terminal of the transistor 46. The resistors 50 and 52 form a voltage divider bias circuit with the junction of the resistors 50 and 52 being connected to the base terminal of the transistor 48 to feed base current to the transistor 48 for establishing the quiescent operating current in the transistor 48 during conduction of that branch of the cascode circuit 14. Similarly, the resistors 58 and 60 are connected serially between the source 68 and a junction 72 between the emitter terminal of the transistor 56 and the collector terminal of the transistor 54. The resistors 58 and 60 form a voltage divider bias circuit with the junction of the resistors 58 and 60 being connected to the base terminal of the transistor 56 to feed base current to the transistor 56 for establishing the quiescent operating current in the transistor 56 during conduction of that branch of the cascode circuit 14.

Upon activation of the transistor 28 to pass current through the cascode circuit 14, the current flows either through the branch of the transistor 42 or the branch of the transistor 44 depending on the presence of gating, or logic, signals to the respective branches. Assuming that the voltage applied to the input terminal 62 is high, and that the base terminal of the transistor 44 is supplied with a nominal value of voltage from a bias circuit (not shown), all of the current from the transistor 28 flows through the transistor 42. Assuming further that the voltage applied to the input terminal 64 is low, and that the base terminal of the transistor 54 is supplied with a nominal value of voltage from a bias circuit (not shown), all of the current from the transistor 28 flows through the transistor 54 and the transistor 56. Output lines 24 and 26 of the cascode circuit 14 connect respectively with the junctions 70 and 72. A low voltage at terminal 64, representing a logic-0 signal, produces a high voltage on line 24 and a low voltage on line 26. A high voltage at terminal 64, representing a logic-1 signal, produces a low voltage on line 24 and a high voltage on line 26.

In accordance with the invention, a preferred embodiment of the driver circuit 16 comprises five NPN bipolar transistors 74, 76, 78, 80 and 82, and three resistors 84, 86 and 88. A base terminal of the transistor 74 is connected to line 24 and a base terminal of the transistor 82 is connected to the line 26 for receiving output signals of the cascode circuit 14. The transistors 74 and 76 are connected serially between the source 68 and a second source 66 of positive voltage Vt, with the emitter terminal of the transistor 74 connected via a junction 90 to the collector terminal of the transistor 76. The voltage Vt at source 66 is less than the voltage Vcc of source 68. The collector terminal of the transistor 74 connects with the source 68, and the emitter terminal of the transistor 76 connects with source 66. The junction 90 serves as output terminal of the driver circuit 16 and connects with the load 22. The transistor 76 acts as a load for the transistor 74. The voltage drop between junction 90 and ground 34 serves as the output voltage of the driver circuit 16.

The transistor 82 and the resistor 88 are connected serially between the source 68 and the source 66, the collector terminal of the transistor being connected to the source 68, and the resistor 88 connecting between the emitter terminal of the transistor 82 and the source 66. The transistor 78 connects at a junction 92 between the transistors 82 and 76, the collector terminal of the transistor 78 connecting with the emitter terminal of the transistor 82 at the junction 92, the emitter and base terminals of the transistor 78 connecting with the base terminal of the transistor 76 at a junction 94. The transistor 80 connects between the base terminal and the collector terminal of the transistor 76, the collector terminal of the transistor 80 connecting with the base terminal of the transistor 76 at the junction 94, and the emitter terminal of the transistor 80 connecting with the collector terminal of the transistor 76 at the junction 90. Upon activation of the transistor 74 to induce current flow therein by application of a high voltage to the base terminal thereof, the transistor 82 is deactivated to terminate current therein by application of a low voltage to the base terminal thereof, due to the complementary relationship of the logic signals on lines 24 and 26. Activation of the transistor 82 produces current flow in the resistor 88 with a relatively high voltage drop across the resistor 88. Deactivation of the transistor 82 terminates current flow in the transistor 82 and produces a relatively low voltage across the resistor 88.

The resistors 84 and 86 are connected serially between the source 68 and the junction 94 between the emitter terminal of the transistor 78 and the base terminal of the transistor 76. This produces a series circuit of the three resistors 84, 86 and 88 and the transistor 78 between the source 68 and source 66. This series circuit back biases the transistor 78 during a state of deactivation of the transistor 82, and also provides a bias voltage, at a junction 96 between the resistors 84 and 86, for applying base current to the base terminal of the transistor 80. During a state of deactivation of the transistor 82, the voltage at the junction 96 back biases the transistor 80 so as to impede forward current flow in the transistor 80. During a state of activation of the transistor 82, the falling voltage at the junction 90 biases the transistor 80 in the forward direction so as to induce forward current flow in the transistor 80. The back-biasing of the transistor 78 induces a relatively high capacitance, as compared to the capacitance during a forward biasing, across the base-collector junction of the transistor 78. The capacitance induced by the back-biasing of the transistor 78 is represented by capacitor 98, shown in phantom.

In operation, and with reference also to FIGS. 3a and 3b, the three graphs A, B and C show waveforms of the input port 64, the line 24 and the line 26, respectively. A load capacitance of 2 picofarads is assumed in the preparation of the graphs of FIGS. 3a and 3b. The reference numerals of FIG. 2 are appended to the waveforms of the respective graphs to facilitate correspondence of a waveform with its location in the circuit of FIG. 2. Upon a negative transition at time T1 in the waveform of graph A of FIG. 3a, there is a positive transition in the waveform of graph B and a negative transition in the waveform of graph C. If desired, a positive transition in the waveform of line 24 or of line 26, may be regarded as a leading edge of a pulse of the waveform, and a negative transition in the waveform may be regarded as a trailing edge. Shortly after these transitions, at time T2, the following voltage states are observed. The transistor 82 is deenergized and the junction 92 shows a low voltage (graph E) with deactivation of the transistor 76. The exponential decay of the voltage at the junction 92 results from stray capacitance associated with elements connected to the junction 92, the decay in voltage arising upon termination of current flow in the transistor 82. The junction 96 (graph G) and the junction 90 (graph D) show nearly the same voltage for deactivation of the transistor 80. The transistor 74 has been activated to urge current through the transistor 76, the pull-up stage, resulting in a decreased voltage drop across the transistor 74 and an increased voltage drop across the transistor 76 as is evidenced by the high voltage at the junction 90 (graph D). It is noticed also that the difference in voltages between the junctions 92 and, 94 is the voltage drop across the capacitor 98.

At this point in the cycle, resistors 84, 86, and 88, and transistors 78 form a current mirror that controls the current in transistor 76. It can be seen in FIG. 2 that the base-emitter voltage of transistor 76 is equal to the base-collector voltage of transistor 78 plus the negligible voltage drop across resistor 88. The current in the current mirror is controlled by design to maintain just enough current in transistor 76 to keep it on the verge of activation without wasting power. This feature provides a significant speed advantage in turning on transistor 76 at the next pull-down signal.

At time T3, in FIG. 3b, the transitions in-voltages at the lines 24 and 26 deactivate the transistor 74 and activate the transistor 82. This increases the voltage drop across the transistor 74 and decreases the voltage drop across the transistor 82. The sudden increase in voltage at the junction 92 is communicated by the capacitor 98 to the base terminal of the transistor 76 resulting in a surge of base current which activates the transistor 76 to pull down the voltage rapidly at the junction 90 and the load 22, this being the pull-down stage. The base current provided by the capacitor 98 is in the nature of a short surge, the surge extending only until the capacitor 98 discharges. However, in accordance with a feature of the invention, the duration of the current surge is sufficient to pull down the voltage at the load 22, and to power the transistor sufficiently to draw current from the capacitive elements of the load 22 to enable a rapid communication of the signal from the input terminal 64 to the load 22.

In order to insure rapid responses of the transistor 76 during successive transitions of the voltages on lines 24 and 26, it is important to prevent the transistor 76 from going into deep saturation from the application of the base current surge to the transistor 76. In accordance with a feature of the invention, during the base current surge provided by the capacitor 98, the falling voltage at junction 90 activates the transistor 80 to conduct excess current from the junction 94 to the junction 90, and thereby prevent saturation of the transistor 76. The anti-saturation feature operates as follows. After time T3, transistor 76 is activated, lowering the voltage at junction 90. When that voltage drops sufficiently below the voltage at junction 96, the base-emitter junction of transistor 80 becomes forward biased and transistor 80 begins to conduct. In order to prevent transistor 76 from becoming saturated, its base-collector voltage must not become sufficiently forward biased to turn on.

It can be seen in FIG. 3b that when the voltage at junction 90 is low, the voltage from the base to the collector of transistor 76 equals the forward voltage of the base-emitter junction of transistor 80 minus the voltage drop across resistor 86. Thus, transistor 76 can be kept out of saturation by selecting the appropriate resistance value for resistor 86. The anti-saturation clamp is self limiting in that any further lowering of the voltage at junction 90 will tend to turn on transistor 80 harder, thereby removing some of the base drive current from transistor 76 at junction 94 and restoring the voltage at junction 90 to its equilibrium value.

Thereby, the invention has accomplished the objective of communicating a logic signal to a load by use of a push-pull operation while protecting the pull-down transistor 76 from saturation. Furthermore, the pull-down transistor 76 is essentially dormant during virtually the complete cycle of the input logic signal at the input terminal 64 so as to minimize power dissipation in the driver circuit 16, the transistor 76 becoming active with high current and high power only during the momentary current surge of the capacitor 98, which surge occurs only once per cycle of the input logic signal. Also, due to the relatively high impedance presented by the pull-down transistor 76 during its quiescent state, there is relatively little average current flow and power dissipation in the pull-up transistor 74, high power occurring in the transistor 74 only at the leading edge of the pull-up portion of the outputted waveform at the junction 90.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A driver circuit responsive to a first logic signal and a second logic signal of a pair of complementary logic signals applied to the driver circuit comprising a first transistor and a second transistor, the second transistor serving in a quiescent state as a load for the first transistor and being connected to an emitter terminal of the first transistor to permit operation of the first transistor as an emitter follower, a voltage at a collector terminal of the second transistor serving as an output voltage of the driver circuit;

bias means for placing said second transistor in a quiescent state during activation of said first transistor, said first transistor being activated in a pull-up mode by a leading edge of said first logic signal;

activation means for activating said second transistor to draw current in a pull-down mode upon the occurrence of a leading edge of said second logic signal;

a first input means and a second input means operatively connected respectively to said first transistor and to said activation means for coupling respectively said first logic signal to said first transistor and said second logic signal to said activation means;

antisaturation means responsive to said second logic signal for maintaining a state of nonsaturation of said second transistor during operation of said activation means; and wherein said activation means comprises a coupling transistor having a collector terminal and an emitter terminal serially connected between said input means and a base terminal of said second transistor, said first transistor and said bias means connecting with a common terminal of a source of voltage for said driver circuit;

said antisaturation means comprises a bypass transistor connected between said base terminal of said second transistor and said collector terminal of said second transistor to conduct current between said base terminal of said second transistor and said collector terminal of said second transistor in a direction opposite to current flow in said second transistor; and said bias means back-biases said coupling transistor prior to a coupling of a signal from said second input means to said second transistor, said bias means back-biasing said bypass transistor prior to an activation of said antisaturation means.

2. A driver circuit according to claim 1 wherein said coupling transistor of said activation means comprises capacitive means coupled to said bias means for storing charge prior to the occurrence of said leading edge of said second logic signal, a stored charge in said capacitive means serving to activate said second transistor.

3. A driver circuit according to claim 1 wherein said bypass transistor of said antisaturation means provides for bypassing excess current from said activation means past said second transistor.

4. A driver circuit responsive to a first logic signal and a second logic signal of a pair of complementary logic signals applied to the driver circuit comprising
- a first transistor and a second transistor, the second transistor serving in a quiescent state as a load for the first transistor and being connected to an emitter terminal of the first transistor to permit operation of the first transistor as an emitter follower, a voltage at a collector terminal of the second transistor serving as an output voltage of the driver circuit;
- bias means for placing said second transistor in a quiescent state during activation of said first transistor, said first transistor being activated in a pull-up mode by a leading edge of said first logic signal;
- activation means for activating said second transistor to draw current in a pull-down mode upon the occurrence of a leading edge of said second logic signal;
- antisaturation means responsive to said second logic signal for maintaining a state of nonsaturation of said second transistor during operation of said activation means;
- wherein said activation means comprises capacitive means coupled to said bias means for storing charge prior to the occurrence of said leading edge of said second logic signal, a stored charge in said capacitive means serving to activate said second transistor;
- said capacitive means is connected to a base terminal of said second transistor; and
- said antisaturation means comprises a bypass transistor connected between said base terminal and said collector terminal of said second transistor to conduct current between said base terminal and said collector terminal of said second transistor in a direction opposite to current flow in said second transistor for bypassing excess current from said capacitive means past said second transistor.

5. A driver circuit responsive to a first logic signal and a second logic signal of a pair of complementary logic signals applied to the driver circuit comprising:
- a first transistor and a second transistor, the second transistor serving in a quiescent state as a load for the first transistor and being connected to an emitter terminal of the first transistor to permit operation of the first transistor as an emitter follower, a voltage at a collector terminal of the second transistor serving as an output voltage of the driver circuit;
- bias means for placing said second transistor in a quiescent state during activation of said first transistor, said first transistor being activated in a pull-up mode by a leading edge of said first logic signal;
- activation means for activating said second transistor to draw current in a pull-down mode upon the occurrence of a leading edge of said second logic signal; and
- antisaturation means responsive to said second logic signal for maintaining a state of nonsaturation of said second transistor during operation of said activation means;
- wherein said activation means comprises capacitive means coupled to said bias means for storing charge prior to the occurrence of said leading edge of said second logic signal, a stored charge in said capacitive means serving to activate said second transistor;
- said capacitive means is connected to a base terminal of said second transistor;
- said antisaturation means comprises a bypass transistor connected between said base terminal and said collector terminal of said second transistor for bypassing excess current from said capacitive means past said second transistor; and
- said capacitive means further comprises
- a coupling transistor which is back-biased by said bias means for increased capacitance across a base-collector junction of said coupling transistor; and
- an input transistor for receiving said second logic signal, and a resistor connected in series with said input transistor to form an input amplifier for said second logic signal, said coupling transistor connecting between said base terminal of said second transistor to said junction of said resistor with said input transistor.

6. A driver circuit according to claim 5 wherein said bias means holds said bypass transistor in a state of deactivation until operation of said activation means, and the capacitance of said coupling transistor places said bypass transistor in a state of conduction upon activation of said second transistor.

7. A driver circuit according to claim 5 wherein
- said bias means holds said second transistor in said quiescent state prior to operation of said activation means; and
- said coupling transistor forms a current mirror to control quiescent current of said second transistor during a state of deactivation.

8. A driver circuit according to claim 6 wherein said bypass transistor increases its state of conduction between the base terminal and the collector terminal of said second transistor as said second transistor approaches saturation, said bypass transistor serving as a negative feedback path to prevent saturation.

9. A method for operating a driver circuit in response to a first logic signal and a second logic signal of a pair of complementary logic signals applied to the driver circuit comprising
- providing the driver circuit with a first transistor and a second transistor, and employing the second transistor in a quiescent state as a load for the first transistor, the second transistor being connected to an emitter terminal of the first transistor to permit operation of the first transistor as an emitter follower, a voltage drop across the second transistor serving as an output voltage of the driver circuit;
- activating said first transistor in a pull-up mode by a leading edge of said first logic signal;
- biasing said second transistor, independently of current flow in said first transistor, in a quiescent state during activation of said first transistor;
- activating said second transistor to draw current in a pull-down mode upon the occurrence of a leading edge of said second logic signal, said driver circuit permitting said activating of said second transistor to be accomplished independently of said activating of said first transistor; and
- maintaining a state of nonsaturation of said second transistor during said activating of said second transistor;
- wherein said maintaining step includes a step of connecting a bypass transistor to conduct current from a base terminal of said second transistor to a collector terminal of said second transistor; and said biasing step includes biasing said bypass transistor to a state of nonconduction during a state of nonconduction of said second transistor.

10. A method according to claim 9 wherein said step of activating includes a step of charging a capacitor with sufficient energy to activate said second transistor, said charging preceding the occurrence of the leading edge of said second logic signal.

11. A method according to claim 10 wherein said step of charging includes a step of forming said capacitor by back-biasing a transistor.

12. A method according to claim 10 wherein said step of maintaining includes a step of forming a current mirror to control the deactivated current of said second transistor in readiness for rapid transition to said activated state.

13. A method according to claim 10 wherein said step of activating includes applying current from said capacitor to a base terminal of said second transistor.

14. A method for operating a driver circuit in response to a first logic signal and a second logic signal of a pair of complementary logic signals applied to the driver circuit comprising:

providing the driver circuit with a first transistor and a second transistor, and employing the second transistor in a quiescent state as a load for the first transistor, the second transistor being connected to an emitter terminal of the first transistor to permit operation of the first transistor as an emitter follower, a voltage drop across the second transistor serving as an output voltage of the driver circuit;

activating said first transistor in a pull-up mode by a leading edge of said first logic signal;

biasing said second transistor in a quiescent state during activation of said first transistor;

activating said second transistor to draw current in a pull-down mode upon the occurrence of a leading edge of said second logic signal; and maintaining a state of nonsaturation of said second transistor during said activating of said second transistor;

wherein said step of activating includes a step of charging a capacitor with sufficient energy to activate said second transistor, said charging preceding the occurrence of the leading edge of said second logic signal;

said step of charging includes a step of forming said capacitor by back-biasing a transistor;

said step of activating includes applying current from said capacitor to a base terminal of said second transistor; and said step of maintaining includes a step of bypassing excess current of said capacitor past said second transistor by means of a bypass transistor.

15. A method according to claim 14 wherein said step of maintaining includes a step of back-biasing said bypass transistor to inhibit conduction thereof prior to said bypassing, said bypassing occurring concurrently with the falling of said output voltage due to said step of applying current from said capacitor to the base terminal of said second transistor.

16. A method according to claim 14 wherein said step of maintaining includes a step of increasing said bypass transistor current as said second transistor approaches saturation, thereby forming a negative feedback path and inhibiting saturation of said second transistor.

* * * * *